United States Patent
Noguchi et al.

(10) Patent No.: US 7,772,711 B2
(45) Date of Patent: Aug. 10, 2010

(54) SEMICONDUCTOR DEVICE INCLUDING SINGLE CRYSTAL SILICON LAYER

(75) Inventors: Takashi Noguchi, Seongnam-si (KR); Hans S. Cho, Seoul (KR); Wenxu Xianyu, Suwon-si (KR); Do-young Kim, Suwon-si (KR); Jang-yeong Kwon, Seongnam-si (KR); Huaxiang Yin, Yongin-si (KR); Kyung-bae Park, Seoul (KR); Xiaoxin Zhang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 689 days.

(21) Appl. No.: 11/430,117

(22) Filed: May 9, 2006

(65) Prior Publication Data
US 2006/0267100 A1 Nov. 30, 2006

(30) Foreign Application Priority Data
May 10, 2005 (KR) .................. 10-2005-0038986

(51) Int. Cl.
*H01L 27/11* (2006.01)
(52) U.S. Cl. .............. 257/903; 365/154; 365/156
(58) Field of Classification Search ........... 257/902, 257/903; 365/154, 156
See application file for complete search history.

(56) References Cited

U.S. PATENT DOCUMENTS

| | | | | | |
|---|---|---|---|---|---|
| 4,862,237 | A | * | 8/1989 | Morozumi | 257/72 |
| 5,124,769 | A | * | 6/1992 | Tanaka et al. | 257/66 |
| 5,250,835 | A | * | 10/1993 | Izawa | 257/408 |
| 5,404,326 | A | * | 4/1995 | Okamoto | 365/156 |
| 7,199,451 | B2 | * | 4/2007 | Kelman | 257/627 |
| 2002/0045302 | A1 | * | 4/2002 | Zhang et al. | 438/199 |
| 2003/0178650 | A1 | * | 9/2003 | Sonoda et al. | 257/204 |
| 2004/0214378 | A1 | * | 10/2004 | Lin et al. | 438/149 |
| 2006/0267491 | A1 | * | 11/2006 | Koo et al. | 313/511 |

* cited by examiner

*Primary Examiner*—Phuc T Dang
(74) *Attorney, Agent, or Firm*—Harness, Dickey & Pierce, P.L.C.

(57) ABSTRACT

A semiconductor device including a substrate, a P-MOS single crystal TFT formed on the substrate, and an N-MOS single crystal TFT formed on the P-MOS single crystal TFT. The source region of the P-MOS single crystal TFT and the source region of the N-MOS single crystal TFT may be connected to each other. The P-MOS single crystal TFT and the N-MOS single crystal TFT may share a common gate. Also, the P-MOS single crystal TFT may include a single crystal silicon layer with a crystal plane of (100) and a crystal direction of <100>. The N-MOS single crystal TFT may include a single crystal silicon layer having the same crystal direction as the single crystal silicon layer of the P-MOS single crystal TFT and having a tensile stress greater than the single crystal silicon layer of the P-MOS single crystal TFT.

22 Claims, 6 Drawing Sheets

SEMICONDUCTOR DEVICE INCLUDING SINGLE CRYSTAL SILICON LAYER

PRIORITY STATEMENT

This application claims the benefit of priority to Korean Patent Application No. 10-2005-0038986, filed on May 10, 2005, in the Korean Intellectual Property Office, the entire contents of which are incorporated herein by reference.

BACKGROUND OF THE INVENTION

1. Field of the Invention

Example embodiments of the present invention relates to a semiconductor device and a manufacturing method thereof, and more particularly, to a semiconductor device including a single crystal silicon layer, a semiconductor apparatus and a flat panel display device including the semiconductor device, and a method of manufacturing the semiconductor device.

2. Description of the Related Art

As industrial technologies develop, a variety of small-sized electronic products having a variety of functions are being introduced. These electronic products may include semiconductor devices (e.g., transistors, memory devices, logic devices, etc.), which alone or in combination provide various functions.

As Internet technology rapidly develops and a variety of electronic products cooperating with the Internet are brought to the market, the amount of information accessed and/or utilized through the Internet rapidly increases. Accordingly, the demand for small-sized electronic products capable of storing large amounts of data and processing the data at high speeds increases, and thus the development of semiconductor devices that may be used for such electronic products is drawing attention.

Accordingly, primary objectives considered when designing semiconductor devices may be summarized as increasing integration density, increasing operating speed and reducing power consumption. In particular, in the case of memory devices, the primary objectives may include securing non-volatility of data and facilitating easy recording and deleting of data.

At least in part because of these objectives, a variety of semiconductor devices intended for various purposes and electronic products applying these semiconductor devices have been introduced. For example, static random access memories (SRAMs), which are memory devices, have advantages of fast processing speed and low power consumption. However, because SRAMs include a relatively large amount of transistors compared to other memory devices, the integration density of SRAMs is relatively low. Accordingly, while the construction of semiconductor devices has changed from plane structures of the prior art to three-dimensional structures, carrier mobility is still relatively low.

SUMMARY OF THE INVENTION

An example embodiment of the present invention provides a semiconductor device capable of increasing carrier mobility and having sufficient integration density.

An example embodiment of the present invention provides a semiconductor apparatus and a flat panel display device that include a semiconductor device having increased carrier mobility and sufficient integration density as a component.

An example embodiment of the present invention also provides a method of manufacturing a semiconductor device.

An example embodiment of the present invention provides a semiconductor device. The semiconductor device may include a substrate; a P-type metal oxide semiconductor (P-MOS) single crystal thin film transistor (TFT) formed on the substrate; and an N-type MOS (N-MOS) single crystal TFT provided on the P-MOS single crystal TFT.

According to an example embodiment of the present invention, a source region of the P-MOS single crystal TFT and a source region of the N-MOS single crystal TFT may be connected to each other. The P-MOS single crystal TFT and the N-MOS single crystal TFT may share a common gate. The P-MOS single crystal TFT may include a single crystal silicon layer whose crystal plane is (100) and whose crystal direction is <100>. The N-MOS single crystal TFT may include a single crystal silicon layer having the same crystal direction as the single crystal silicon layer of the P-MOS single crystal TFT and having tensile stress greater than the single crystal silicon layer of the P-MOS single crystal TFT. The substrate may be formed of one of silicon on insulator (SOI) substrate, glass, and plastic.

An example embodiment of the present invention provides a static random access memory (SRAM). The SRAM may include a substrate; a pull-up TFT, a pull-down TFT, and a pass TFT formed on the substrate, wherein the pull-up TFT and the pull-down TFT are sequentially stacked, and the pull-up TFT and the pull-down TFT are a P-MOS single crystal TFT and an N-MOS single crystal TFT, respectively.

An example embodiment of the present invention provides a logic device. The logic device may include a P-MOS transistor; and an N-MOS transistor, wherein the P-MOS transistor and the N-MOS transistor are sequentially stacked, and the P-MOS transistor and the N-MOS transistor are a P-MOS single crystal TFT and an N-MOS single crystal TFT, respectively.

An example embodiment of the present invention provides a flat panel display. The flat panel display may include a system chip mounted on a flat display panel, the system chip including a P-MOS transistor and an N-MOS transistor, wherein the P-MOS transistor and the N-MOS transistor are sequentially stacked, and the P-MOS transistor and the N-MOS transistor are a P-MOS single crystal TFT and an N-MOS single crystal TFT, respectively.

In the SRAM, the logic device, and the flat panel display device, the P-MOS single crystal TFT and the N-MOS single crystal TFT may share a common gate. The P-MOS single crystal TFT may include a single crystal silicon layer with a crystal plane of (100) and a crystal direction of <100>. The N-MOS single crystal TFT may include a single crystal silicon layer having the same crystal direction as the single crystal silicon layer of the P-MOS single crystal TFT and having greater tensile stress than the single crystal silicon layer of the P-MOS single crystal TFT. At this point, the substrate may be formed of one of SOI, glass, and plastic.

An example embodiment of the present invention provides a method of manufacturing a semiconductor device. The method may include: forming a first single crystal silicon layer on a region of a substrate; sequentially forming a first gate insulation layer and a first gate on a region of the first single crystal silicon layer; implanting p-type conductive impurities into the first single crystal silicon layer using the first gate as a mask; forming an interlayer insulation layer covering the first gate and the first single crystal silicon layer on the substrate; forming a second single crystal silicon layer having the same crystal direction as the first single crystal silicon layer and having a tensile stress greater than the first single crystal silicon layer on a region of the interlayer insulation layer; sequentially stacking a second gate insulation layer and a second gate on a region of the second single crystal silicon layer; and implanting n-type conductive impurities into the second single crystal silicon layer using the second gate as a mask.

According to an example embodiment of the present invention, the forming of the second single crystal silicon layer of the method above may include: forming, in the interlayer insulation layer, a contact hole exposing a region of the first single crystal silicon layer in which the p-type conductive impurities may be implanted; filling the contact hole with a conductive plug; and forming the second single crystal silicon layer covering an exposed upper surface of the conductive plug on the interlayer insulation layer.

According to an example embodiment of the present invention, the forming of the first single crystal silicon layer may include: growing an amorphous silicon layer on the substrate; ion-implanting silicon in the amorphous silicon layer; and illuminating the amorphous silicon layer to which the silicon is ion-implanted with an excimer laser.

According to an example embodiment of the present invention, the forming of the second single crystal silicon layer may include: growing an amorphous silicon layer covering the upper surface of the conductive plug on the interlayer insulation layer; ion-implanting silicon in the amorphous silicon layer; and illuminating the amorphous silicon layer to which the silicon is ion-implanted with an excimer laser.

According to an example embodiment of the present invention, the integration degree of the semiconductor device and the semiconductor apparatus using the same may be increased. Also, in a semiconductor device according to an example embodiment of the present invention, a single crystal silicon layer of the N-MOS single crystal TFT has greater tensile stress than the single crystal silicon layer of the P-MOS single crystal TFT, and the single crystal silicon layer of the P-MOS single crystal TFT has a crystal plane of (100) and a crystal direction of <100>. Therefore, the integration degree may be increased and the carrier mobility may be increased. Also, a flat panel display device having a system chip that includes such a semiconductor device according to an example embodiment of the present invention may maintain constant operating characteristics, enhance performance, and display a high quality image.

BRIEF DESCRIPTION OF THE DRAWINGS

The above and other features and advantages of the present invention will become more apparent to those of ordinary skill in the art by describing in detail example embodiments of the present invention with reference to the attached drawings in which.

DETAILED DESCRIPTION OF EXAMPLE EMBODIMENTS OF THE PRESENT INVENTION

Figure 1:
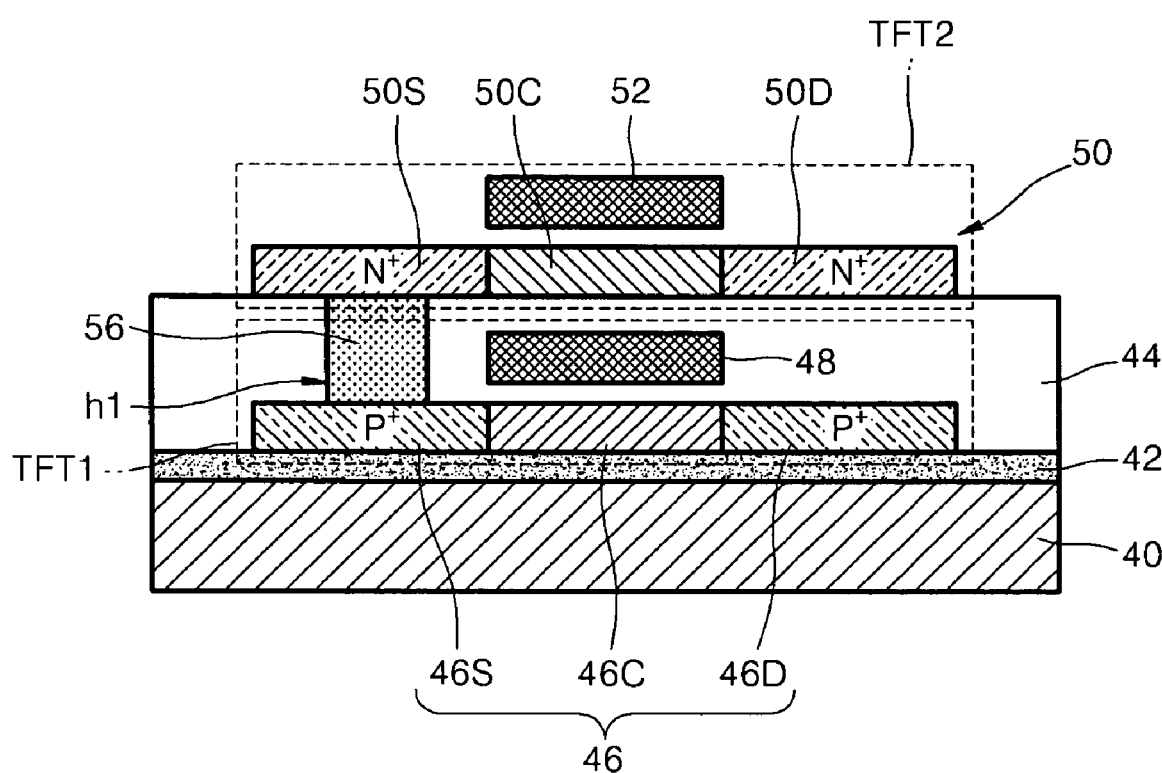
FIG. 1 is a sectional view of a semiconductor device according to an example embodiment of the present invention.

Detailed illustrative embodiments of the present invention are disclosed herein. However, specific structural and functional details disclosed herein are merely representative for purposes of describing example embodiments of the present invention. This invention may, however, be embodied in many alternate forms and should not be construed as limited to only the embodiments set forth herein.

Accordingly, while example embodiments of the present invention are capable of various modifications and alternative forms, embodiments of the present invention are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments of the present invention will now be described more fully with reference to the accompanying drawings. In the drawings, the thicknesses of layers and/or regions are exaggerated for clarity.

FIG. 1 is a sectional view of a semiconductor device according to an example embodiment of the present invention. Referring to FIG. 1, a buffer oxidation layer 42 may be formed on a semiconductor substrate 40. The buffer oxidation layer 42 may be formed of silicon oxide ($SiO_2$), for example. A first single crystal silicon layer 46 may be formed on the buffer oxidation layer 42. The first single crystal silicon layer 46 may be divided into a source region 46S, a channel region 46C and a drain region 46D. The source region 46S and the drain region 46D may be doped with conductive impurities, for example, p+ conductive impurities as shown in FIG. 1. The channel region 46C may have a crystal plane of (100) and a crystal direction of <100>. A gate 48 may be formed on the channel region 46C of the first single crystal silicon layer 46. A gate insulation layer may be formed between the gate 48 and the channel region 46C. The gate 48, the source region 46S, the drain region 46D, and the channel region 46C may constitute a first P-MOS (metal oxide semiconductor) TFT1; The first P-MOS TFT1 may be covered with an interlayer insulation layer 44. The interlayer insulation layer 44 may be formed of silicon oxide, for example. A contact hole h1 exposing one of the source region 46S and the drain region 46D may be formed in the interlayer insulation layer 44. The contact hole h1 may be filled with a conductive plug 56. A second single crystal silicon layer 50, which may cover an exposed portion of the conductive plug 56, may be formed on the interlayer insulation layer 44. The second single crystal silicon layer 50 may be formed using a method. For example, the second single crystal silicon layer 50 may be formed by a method including illuminating an amorphous silicon layer with an excimer laser. The second single crystal silicon layer 50 may be divided into a source region 50S, a channel region 50C, and a drain region 50D. The source region and the drain region 50S and 50D may be doped with conductive impurities, for example, n+ type conductive impurities as shown in FIG. 1. The channel region 50C may have the same crystal direction as the channel region 46C of the first single crystal silicon layer 46. A gate 52 may be formed on the channel region 50C of the second single crystal silicon layer 50. A gate insulation layer may be formed between the gate 52 and the channel region 50C.

The gate 52, the source region 50S and the drain region 50D doped with n+ conductive impurities, and the channel region 50C may constitute a second N-MOS TFT2. It is noted that the gates 48 and 52 of the first P-MOS TFT1 and the second N-MOS TFT2 may be replaced by one common gate according to an example embodiment of the present invention.

As shown in FIG. 1, a semiconductor device according to an example embodiment of the present invention may include a P-MOS single crystal TFT and an N-MOS single crystal TFT that are vertically stacked.

A semiconductor device according to an example embodiment of the present invention may be included in a variety of different semiconductor apparatuses.

Figure 2:
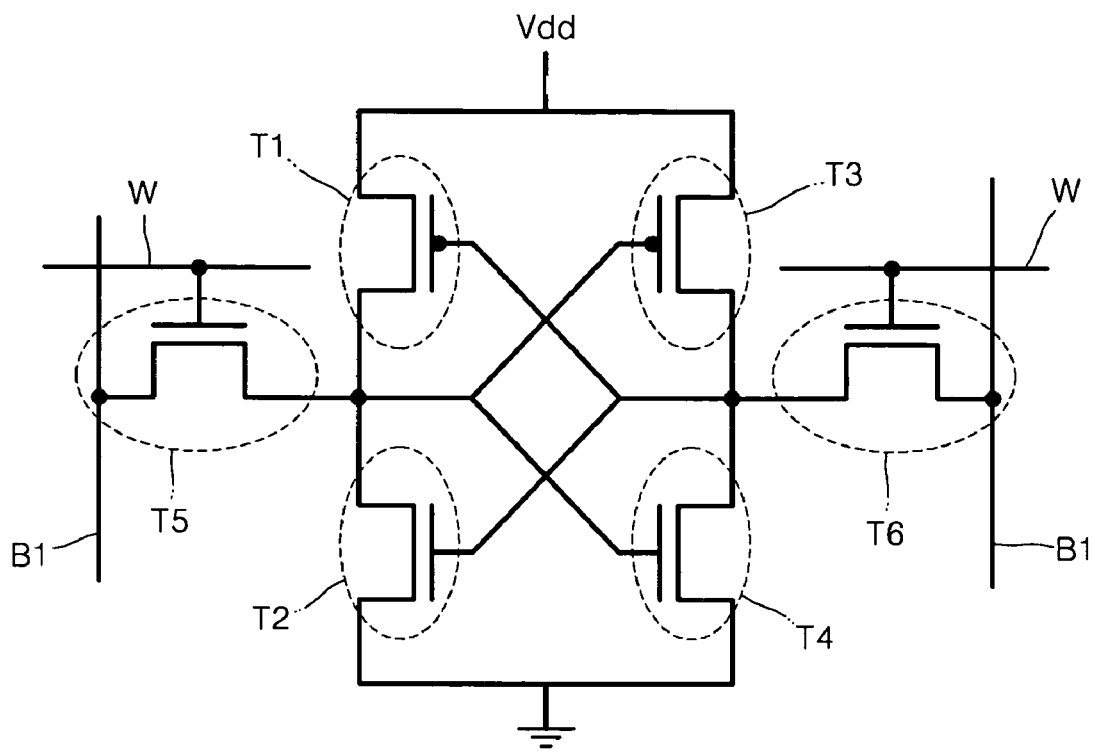
FIG. 2 is a circuit diagram of a SRAM according to an example embodiment of the present invention, which is an example of a semiconductor apparatus that may include the semiconductor device of FIG. 1 as a component.

For example, FIG. 2 is a circuit diagram of a full-CMOS type SRAM, which is one example of a semiconductor apparatus that may include the semiconductor device of FIG. 1 as a component.

As shown in FIG. 2, the SRAM may include a first TFT T1 through sixth TFT T6. The second TFT T2 and the fourth TFT T4 may be N-MOS pull down TFTs, and the first TFT T1 and the third TFT T3 may be P-MOS pull up TFTs. The fifth TFT T5 and the sixth TFT T6 may be N-MOS pass TFTs. In FIG. 2, W and B1 represent a word line and a bit line, respectively.

In the SRAM illustrated in FIG. 2, the first and second TFTs T1 and T2, and the third and fourth TFTs T3 and T4 may be formed as illustrated in FIG. 1. Thus, the first TFT1 of FIG. 1 may be the first TFT T1 or the third TFT T3 of the SRAM of FIG. 2 and the second TFT2 of FIG. 1 may be the second TFT T2 or the fourth TFT T4 of the SRAM of FIG. 2.

Logic devices, for example, inverters, NOR gates, NAND gates, etc., may include P-MOS transistors and/or N-MOS transistors. Therefore, because transistors of logic devices may be replaced by TFTs, a semiconductor device according to an example embodiment of the present invention may be applied to or used in logic devices, for example, inverters, NOR gates, NAND gates, etc.

Figure 3:
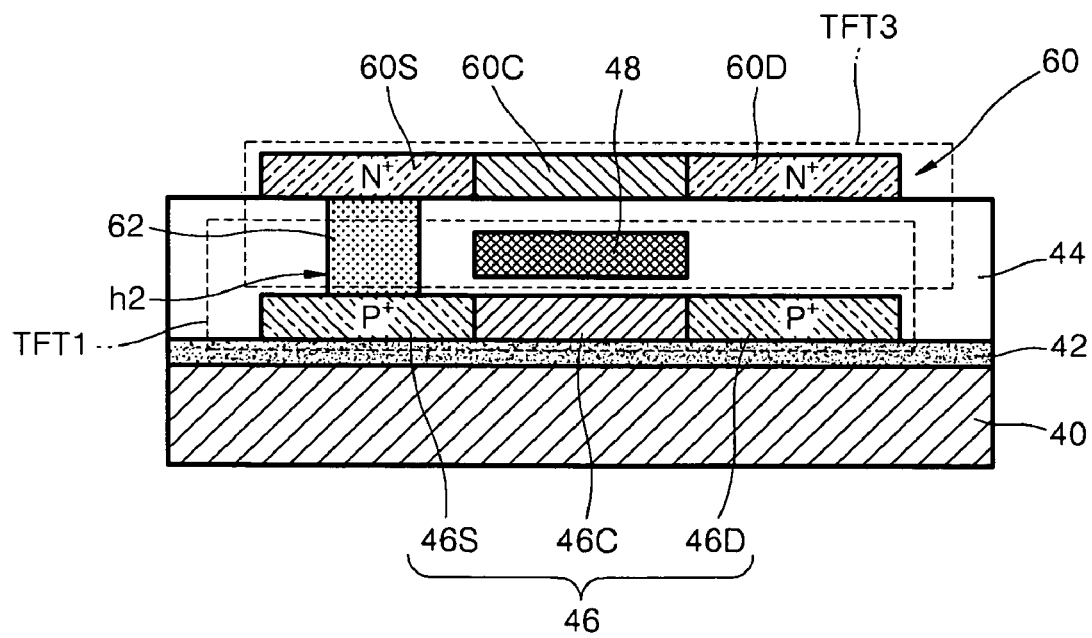
FIG. 3 is a sectional view of an inverter according to an example embodiment of the present invention.

FIG. 3 is a sectional view of an inverter according to an example embodiment of the present invention.

Referring to FIG. 3, a buffer oxidation layer 42 may be formed on a silicon substrate 40. A first TFT1 may be formed on the buffer oxidation layer 42. The first TFT1 may be covered with an interlayer insulation layer 44. The interlayer insulation layer 44 may be formed of silicon oxide, for example. A hole h2 exposing a source region 46S of the first TFT1 may be formed in the interlayer insulation layer 44. The hole h2 may be substantially filled with a conductive plug 62. A second single crystal silicon layer 60 may be formed on the interlayer insulation layer 44. The second single crystal silicon layer 60 may be divided into a source region 60S, a channel region 60C, and a drain region 60D. The second single crystal silicon layer 60 may be disposed such that the channel region 60C is formed over the channel region 46C of the first single crystal silicon layer 46. The second single crystal silicon layer 60 and a gate 48 of the first TFT1 may constitute a third TFT3. That is, the first and third TFT1 and TFT3 may share the gate 48.

Though not shown, one skilled in the art will appreciate that a semiconductor device according to an example embodiment of the present invention may be used for a memory device (e.g., RAM), a system chip, a driving circuit mounted in a flat panel display device such as, for example, an LCD and an electro luminescent display (ELD).

The inventor of the present invention has carried out an experiment for comparing tensile stress intensity of the single crystal silicon layer of a P-MOS TFT with that of the single crystal silicon layer of an N-MOS TFT stacked on the P-MOS TFT in a semiconductor device according to an example embodiment of the present invention.

Figure 4:
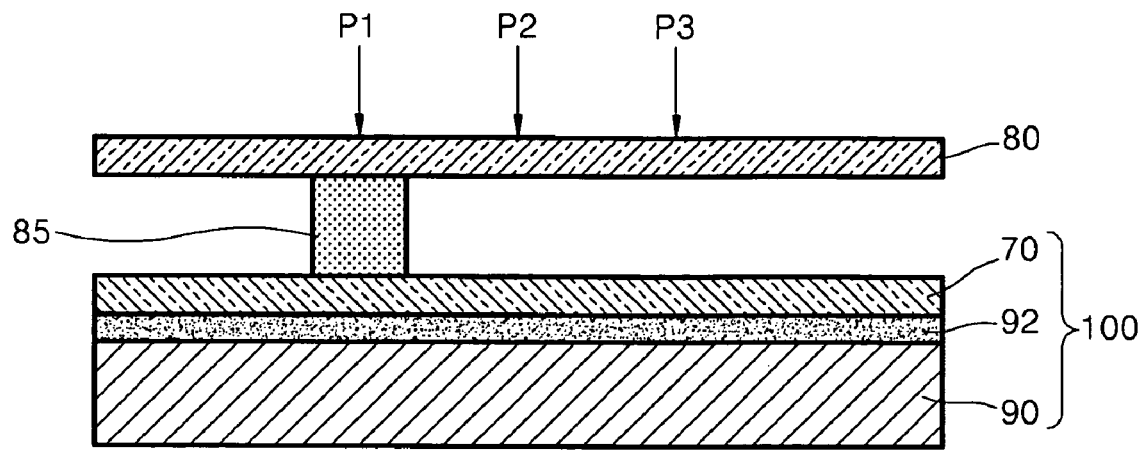
FIG. 4 is a sectional view of a subject material used in an experiment for appraising the tensile stress of a second single crystal silicon layer of a semiconductor device according to an example embodiment of the present invention as shown in FIG. 1.

FIG. 4 is a sectional view of a subject material used in an experiment for appraising the tensile stress of a second single crystal silicon layer of the semiconductor device of FIG. 1. The subject matter for the experiment includes an SOI substrate 100 where a semiconductor substrate 90, a silicon oxidation film 92, and a first single crystal silicon layer 70 are sequentially stacked, and a second single crystal silicon layer 80 connected to the SOI substrate 100 via a conductive plug 85 as illustrated in FIG. 4. The second single crystal silicon layer 80 is formed using a method that uses an amorphous silicon layer and an excimer laser. Also, the first single crystal silicon layer 70 is formed using a single crystal silicon layer having a crystal plane of (100) and a crystal direction of <100>, as previously described with respect to the first single crystal silicon layer 46 of a semiconductor device according to an example embodiment of the present invention as illustrated in FIGS. 1 and 3. Also, the second single crystal silicon layer 80 is formed using a single crystal silicon layer having the same crystal direction as the second single crystal silicon layer 50 or 60 of a semiconductor device according to an example embodiment of the present invention as illustrated in FIGS. 1 and 3, respectively. To check whether a tensile stress exists in the second single crystal silicon layer 80, Raman shift intensities are measured at first through third points P1-P3 of the second single crystal silicon layer 80, and the measured Raman shift intensities at the respective points are compared with respect to the first and second single crystal silicon layers 70 and 80.

Figure 5:
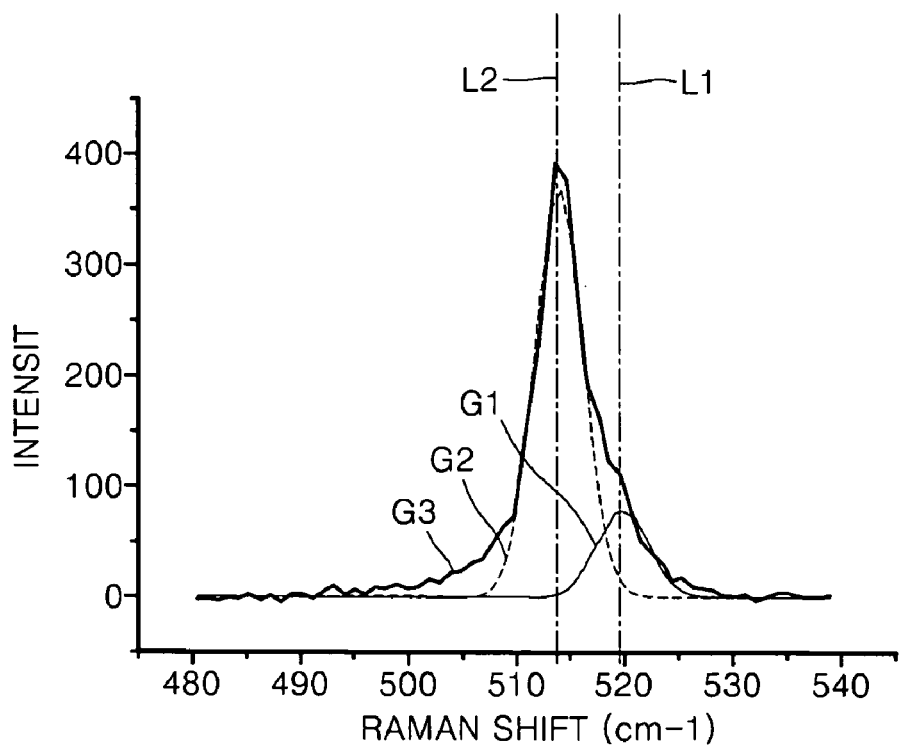
FIG. 5 is a graph illustrating the intensity of a Raman shift measured for the subject material illustrated in FIG. 4.

FIG. 5 is a graph illustrating the intensity of the Raman shift measured at the second point P2 of the second single crystal silicon layer 80. Though not shown, results measured at the first and third points P1 and P3 were similar to those illustrated in FIG. 5.

Referring to FIG. 5, a first graph G1 illustrates Raman shift measurement results for the first single crystal silicon layer 70; a second graph G2 illustrates Raman shift measurement results for the second single crystal silicon layer 80; and a third graph G3 illustrates the sum of the first graph G1 and the second graph G2.

Table 1 summarizes characteristics of the first and second graphs G1 and G2 illustrated in FIG. 5.

TABLE 1

| Graph | Area | Center | Width | Height |
|---|---|---|---|---|
| Second graph G2 | 2085.5 | 513.96 | 4.5066 | 369.23 |
| First graph G1 | 476.51 | 519.85 | 4.8505 | 78.384 |

In Table 1, values in the Center column represent Raman shift values at points where vertical lines L1 and L2 parallel to a vertical axis and passing through the maximum peaks of respective graphs and a horizontal axis intersect. Values in the Area column represent areas of the respective graphs, values in the Width column represent widths of the respective graphs measured at a medium height of the respective graphs, and values in the Height column represent heights of the respective graphs measured at a position where the maximum peaks of the respective graphs are located.

Referring to FIG. 5 and Table 1, the intensity illustrated in the second graph G2 is much greater than the intensity illustrated in the first graph G1. The intensities of the first and second graphs G1 and G2 represent tensile stresses of the first and second single crystal silicon layers 70 and 80, respectively. Accordingly, it is revealed that the tensile stress of the second single crystal silicon layer 80 is much greater than that of the first single crystal silicon layer 70 from the results illustrated in FIG. 5.

Since the first and second single crystal silicon layers 70 and 80 of the subject material for the experiment, which provided the results of FIG. 5, are substantially the same as the first single crystal silicon layer 46 and the second single crystal silicon layers 50 and 60 of a semiconductor device according to an example embodiment of the present invention as illustrated in FIGS. 1 and 3, FIG. 5 indicates that the tensile stresses of the second single crystal silicon layers 50 and 60 of the semiconductor device of FIGS. 1 and 3 are much greater than the tensile stress of the first single crystal silicon layer 46.

Tables 2 and 3 summarize the characteristics of graphs measuring Raman shift for the first and third points P1 and P3. Considering values of Tables 2 and 3, it is revealed that the relationships between the first and second graphs in Tables 2 and 3 are similar to the relationship between the first graph G1 and the second graph G2 illustrated in FIG. 5.

TABLE 2

| Graph | Area | Center | Width | Height |
|---|---|---|---|---|
| Second graph G2 | 5176.5 | 512.76 | 6.1066 | 676.36 |
| First graph G1 | 449.29 | 520.74 | 4.3269 | 82.849 |

TABLE 3

| Graph | Area | Center | Width | Height |
|---|---|---|---|---|
| Second graph G2 | 4730.2 | 515.59 | 5.1973 | 726.18 |
| First graph G1 | 345.57 | 522.9 | 5.3411 | 51.623 |

Figure 6:
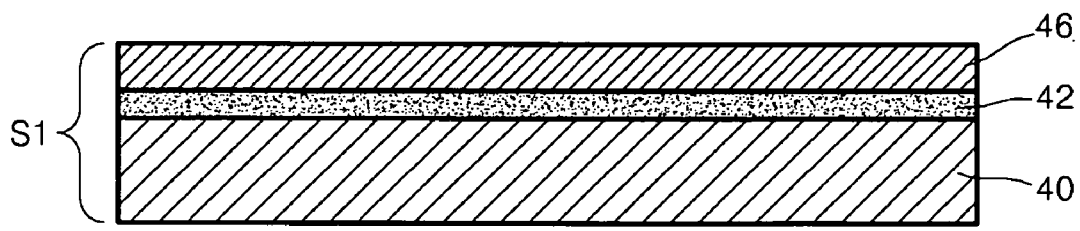
FIGS. 6 through 12 are sectional views illustrating a method of manufacturing a semiconductor device according to an example embodiment of the present invention.

FIGS. 6 through 12 are sectional views for explaining a method of manufacturing a semiconductor device according to an example embodiment of the present invention. Referring to FIG. 6, an SOI substrate S1 may be formed by sequentially stacking a silicon substrate 40, a silicon oxidation layer 42, and a first single crystal silicon layer 46. The SOI substrate S1 may include the first single crystal silicon layer 46, which may have a crystal plane of (100) and a crystal direction of <100>. It is noted that the SOI substrate S1 may be replaced by a glass substrate or a plastic substrate according to an example embodiment of the present invention.

Figure 7:
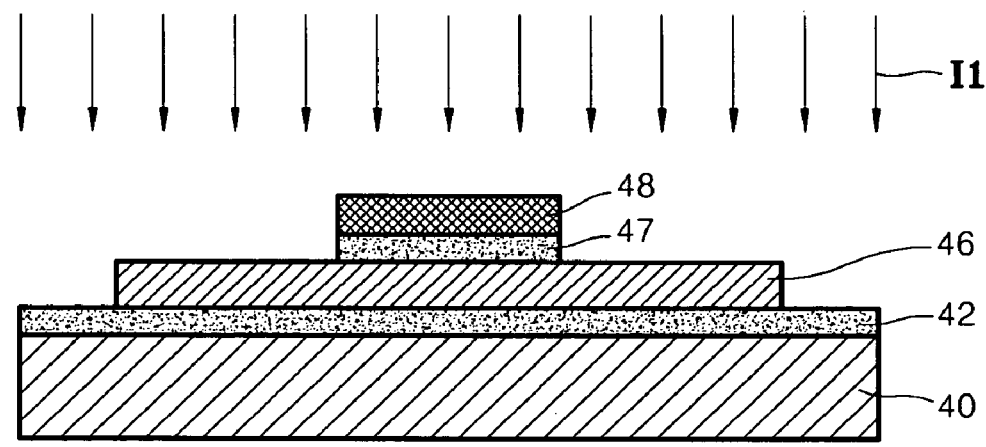
Figure 8:
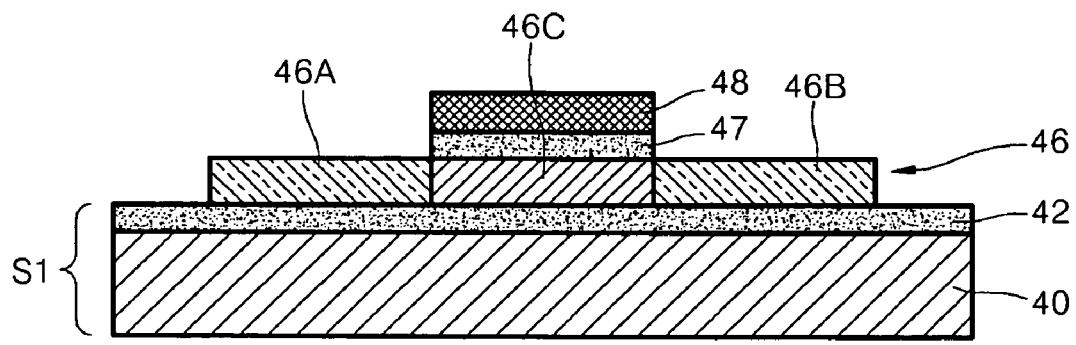

Referring to FIG. 7, a gate insulation layer 47 and a gate 48 may be sequentially formed on a region of the first single crystal silicon layer 46 in a pattern of a unit cell. The gate insulation layer 47 may be formed of silicon oxide, for example. After the gate 48 is formed, conductive impurities 11 may be ion-implanted in an exposed region of the first single crystal silicon layer 46 using the gate 48 as a mask. The conductive impurities 11 may be p-type impurities, for example. As a result of the ion-implantation, first and second impurity regions 46A and 46B may be formed in the first single crystal silicon layer 46 as illustrated in FIG. 8. The first impurity region 46A may correspond to the source region 46S of FIG. 1 or FIG. 3, and the second impurity region 46B may correspond to the drain region 46D of FIG. 1 or FIG. 3.

Figure 9:
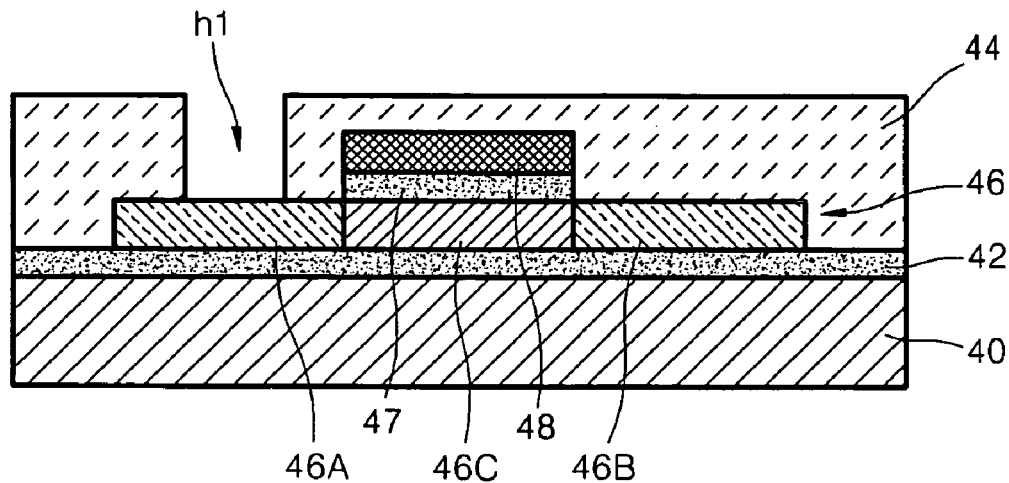

The formation of the first and second impurity regions 46A and 46B in the first single crystal silicon layer 46 may complete the formation of a P-MOS TFT on the SOI substrate S1 according to an example embodiment of the present invention. Subsequently, as shown in FIG. 9, an interlayer insulation layer 44 covering the P-MOS TFT may be formed on the silicon oxidation layer 42 (buffer layer) of the SOI substrate S1, and then a top surface of the interlayer insulation layer 44 may be planarized. The interlayer insulation layer 44 may be formed of silicon oxide using a CVD method, for example. A contact hole h1 exposing the first impurity region 46A may be formed in the interlayer insulation layer 44.

Figure 10:
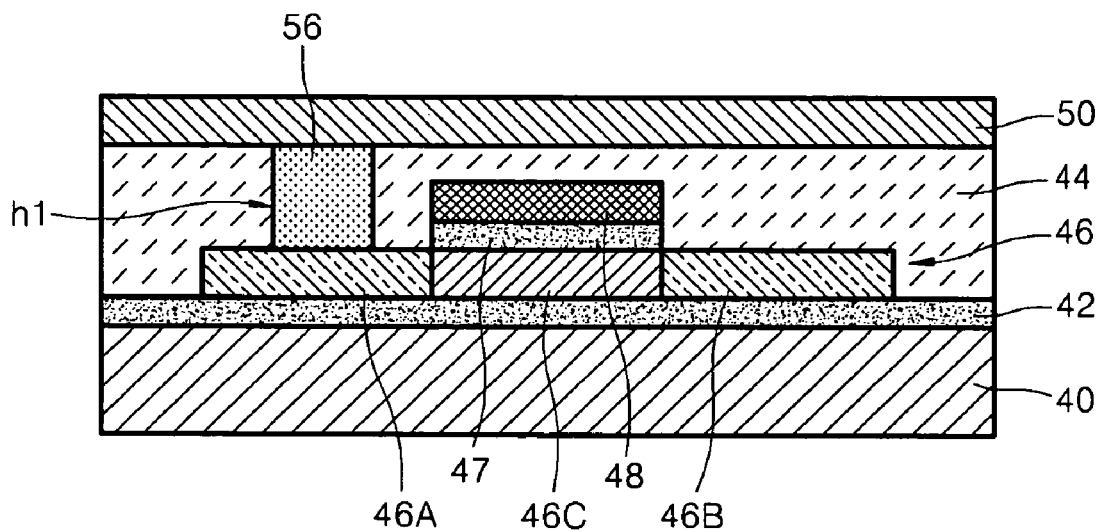
Figure 11:
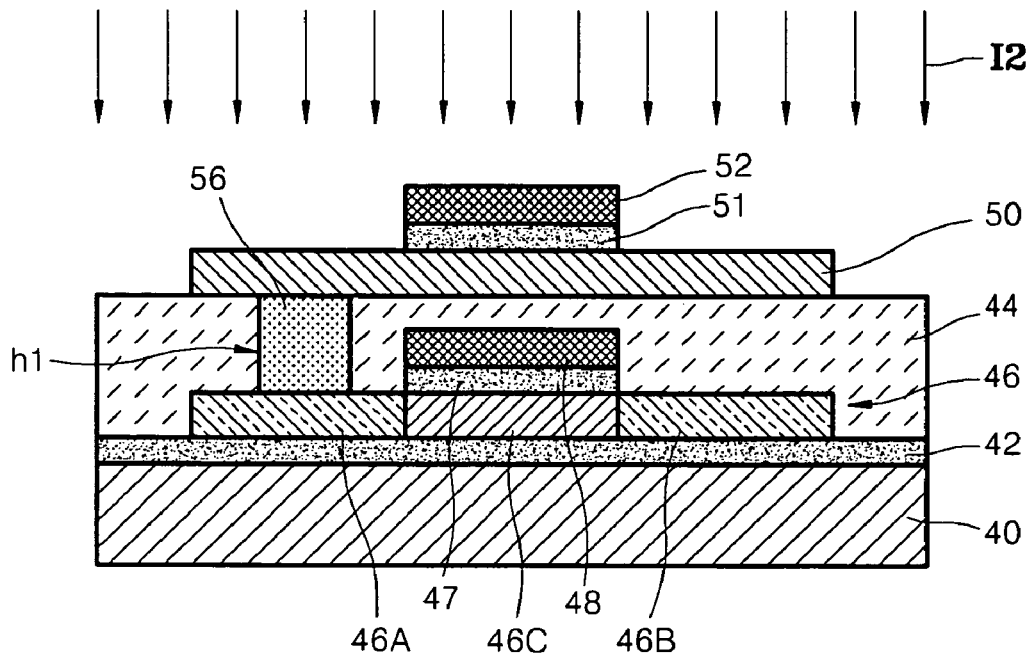
Figure 12:
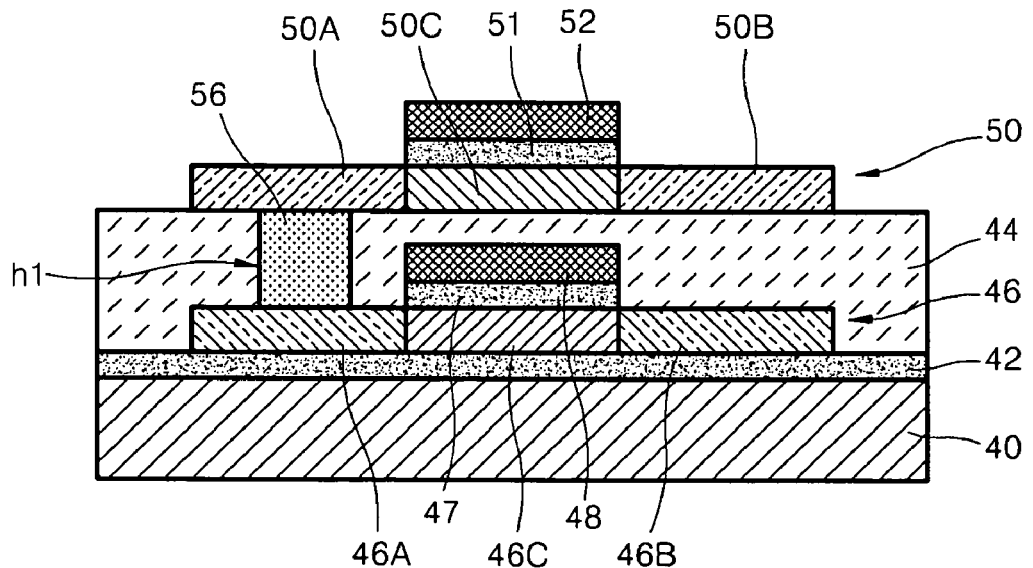

Referring to FIG. 10, the contact hole h1 may be filled with a conductive plug 56. Next, a second single crystal silicon layer 50, which may cover an upper surface of the conductive plug 56, may be formed on the interlayer insulation layer 44. The second single crystal silicon layer 50 may be formed using a method that includes, for example illuminating an amorphous silicon layer using an excimer laser. During the formation of the second single crystal silicon layer 50, the crystal direction of the second single crystal silicon layer 50 may be substantially similar to the crystal direction of the first single crystal silicon layer 46. After the second single crystal silicon layer 50 is formed as described above, the second single crystal silicon layer 50 may be patterned in a shape as illustrated in FIG. 11. Further, the second single crystal silicon layer 50 may be patterned in substantially the same shape as the first single crystal silicon and may be formed over the first single crystal silicon layer 46. Referring to FIG. 11, a gate insulation layer 51 and a gate 52 may be sequentially formed on a region of the second single crystal silicon layer 50 patterned in a shape. The gate insulation layer 51 may be formed of the same material as the gate insulation layer 47 of the P-MOS TFT. After the formation of the gate 52, conductive impurities 12 may be ion-implanted in an exposed region of the second single crystal silicon layer 50 using the gate 52 as a mask. The conductive impurities 12 may be n-type impurities, for example. As a result of the ion implantation, third and fourth impurity regions 50A and 50B may be spaced apart by a width corresponding to the gate 52 and may be formed in the second single crystal silicon layer 50 as illustrated in FIG. 12. A portion covered by the gate insulation layer 51 between the third and fourth impurity regions 50A and 50B of the second single crystal silicon layer 50 may become a channel region 50C. The third and fourth impurity regions 50A and 50B may correspond to the source region 50S and the drain region 50D of FIG. 1, respectively. Therefore, the gate 52, the channel region 50C, the third and fourth impurity regions 50A and 50B formed by the ion implantation of the n-type impurities may constitute an N-MOS TFT.

Thus, a method according to an example embodiment of the present invention may be used to form a semiconductor device having a P-MOS TFT and an N-MOS TFT that are sequentially stacked. Since the semiconductor device may constitute part of a complementary metal-oxide-semiconductor (CMOS), a memory device, a logic device, etc., the method for manufacturing the semiconductor device according to an example embodiment of the present invention may be applied to methods of manufacturing CMOS devices, memory devices, logic devices, etc. Also, since the CMOS, the memory device, the logic device, etc., may be manufactured on a glass substrate in a system on glass (SOG) and/or a plastic substrate in a system on plastic (SOP), the method for manufacturing a semiconductor device according to an example embodiment of the present invention may be readily applied to methods of manufacturing SOGs and SOPs.

Example embodiments of the present invention should be considered in a descriptive sense only and not for purposes of limiting the scope of the present invention. For example, a person of ordinary skill in the art may change a method of manufacturing an SOI substrate and/or may form the second single crystal silicon layer using a different method without departing from the scope of the present invention as described with respect to the example embodiments of the present invention described above. Further, for example, the vertical positions of the single crystal TFTs may be exchanged without departing from the scope of the present invention.

As described above, a semiconductor device according to an example embodiment of the present invention may include a P-MOS single crystal TFT and an N-MOS single crystal TFT, which may be vertically stacked. Therefore, an integration degree of a semiconductor device according to an example embodiment of the present invention may be increased. Also, according to a semiconductor device according to an example embodiment of the present invention, a single crystal silicon layer of the N-MOS single crystal TFT has greater tensile stress than the single crystal silicon layer of the P-MOS single crystal TFT. Further, according to an example embodiment of the present invention, a single crystal silicon layer of the P-MOS single crystal TFT may have a crystal plane of (100) and a crystal direction of <100>. Therefore, in a semiconductor device according to an example embodiment of the present invention, the integration degree may be increased and electron and hole carrier mobility may be increased. Also, a flat panel display device mounting a system chip that includes a semiconductor device according to an example embodiment of the present invention may maintain constant operating characteristics of the flat panel display device, enhance performance of the flat panel display device, and display a high quality image. However, it should be noted that many other apparatuses could include a system chip including a semiconductor device according to an example embodiment of the present invention.

While the present invention has been particularly shown and described with reference to example embodiments of the present invention, it will be understood by those of ordinary skill in the art that various changes in form and/or details may be made therein without departing from the spirit and scope of the present invention.

What is claimed is:

1. A semiconductor device comprising:
   a P-MOS (P-type metal oxide semiconductor) single crystal TFT (thin film transistor); and
   an N-MOS (N-type metal oxide semiconductor) single crystal TFT, wherein the P-MOS single crystal TFT and the N-MOS single crystal TFT are sequentially stacked.

2. The semiconductor device of claim 1, further comprising:
   a substrate, wherein the P-MOS single crystal TFT is formed on the substrate, and the N-MOS single crystal TFT is formed on the P-MOS single crystal TFT.

3. The semiconductor device of claim 2, wherein a source region of the P-MOS single crystal TFT and a source region of the N-MOS single crystal TFT are connected to each other.

4. The semiconductor device of claim 3, wherein the P-MOS single crystal TFT and the N-MOS single crystal TFT share a common gate.

5. The semiconductor device of claim 2, wherein the P-MOS single crystal TFT includes a single crystal silicon layer with a crystal plane of (100) and a crystal direction of <100>.

6. The semiconductor device of claim 5, wherein the N-MOS single crystal TFT includes a single crystal silicon layer having the same crystal direction as the single crystal silicon layer of the P-MOS single crystal TFT and having greater tensile stress than the single crystal silicon layer of the P-MOS single crystal TFT.

7. The semiconductor device of claim 2, wherein the substrate is formed of one of SOI (silicon on insulator), glass, and plastic.

8. The semiconductor device of claim 1, wherein the semiconductor device is an SRAM (static random access memory), the P-MOS single crystal TFT is a pull-up TFT, the N-MOS single crystal TFT is a pull-down TFT, the SRAM further comprising:
   a substrate; and
   a pass TFT formed on the substrate.

9. The semiconductor device of claim 8, wherein the P-MOS single crystal TFT and the N-MOS single crystal TFT share a common gate.

10. The semiconductor device of claim 8, wherein the P-MOS single crystal TFT includes a single crystal silicon layer with a crystal plane of (100) and a crystal direction of <100>.

11. The semiconductor device of claim 10, wherein the N-MOS single crystal TFT includes a single crystal silicon layer having a same crystal direction as the single crystal silicon layer of the P-MOS single crystal TFT and having greater tensile stress than the single crystal silicon layer of the P-MOS single crystal TFT.

12. The semiconductor device of claim 8, wherein the substrate is formed of one of SOI, glass, and plastic.

13. The semiconductor device of claim 1, wherein the semiconductor device is a logic device.

14. The semiconductor device of claim 13, wherein the P-MOS single crystal TFT and the N-MOS single crystal TFT share a common gate.

15. The semiconductor device of claim 13, wherein the P-MOS single crystal TFT includes a single crystal silicon layer with a crystal plane of (100) and a crystal direction of <100>.

16. The semiconductor device of claim 15, wherein the N-MOS single crystal TFT includes a single crystal silicon layer having the same crystal direction as the single crystal silicon layer of the P-MOS single crystal TFT and having tensile stress greater than the single crystal silicon layer of the P-MOS single crystal TFT.

17. The semiconductor device of claim 13, wherein a substrate is formed of one of SOI, glass, and plastic.

18. A flat panel display device comprising:
a system chip mounted on a flat display panel, the system chip including the semiconductor device according to claim 1.

19. The flat panel display device of claim 18, wherein the P-MOS single crystal TFT and the N-MOS single crystal TFT share a common gate.

20. The flat panel display device of claim 18, wherein the P-MOS single crystal TFT includes a single crystal silicon layer with a crystal plane of (100) and a crystal direction of <100>.

21. The flat panel display device of claim 20, wherein the N-MOS single crystal TFT includes a single crystal silicon layer having the same crystal direction as the single crystal silicon layer of the P-MOS single crystal TFT and having tensile stress greater than the single crystal silicon layer of the P-MOS single crystal TFT.

22. The flat panel display device of claim 18, wherein the semiconductor device includes a substrate formed of one of SOI, glass, and plastic.

* * * * *